United States Patent [19]

Drucker

[11] 4,313,209
[45] Jan. 26, 1982

[54] PHASE-LOCKED LOOP FREQUENCY SYNTHESIZER INCLUDING COMPENSATED PHASE AND FREQUENCY MODULATION

[75] Inventor: Eric R. Drucker, Seattle, Wash.

[73] Assignee: John Fluke Mfg. Co., Inc., Mountlake Terrace, Wash.

[21] Appl. No.: 168,170

[22] Filed: Jul. 14, 1980

[51] Int. Cl.³ ............................ H04B 1/04; H03C 3/02
[52] U.S. Cl. ...................................... 455/112; 331/23;
  332/18; 332/19; 332/23 R; 455/113
[58] Field of Search ................. 455/110, 112, 113, 42;
  332/18, 19, 23 R; 331/15, 23

[56] References Cited

U.S. PATENT DOCUMENTS 4,052,672 10/1977 Enderby et al. ..................... 455/113
4,242,649 12/1980 Washburn, Jr. ..................... 331/23

*Primary Examiner*—Marc E. Bookbinder
*Attorney, Agent, or Firm*—Christensen, O'Connor, Johnson & Kindness

[57] ABSTRACT

A phase-locked loop is disclosed that exhibits flat modulation characteristics over a wide range of carrier frequencies for either frequency or phase modulation at rates that are both within and outside the loop bandwidth. The disclosed arrangement is a programmable divide-by-N phase-locked loop frequency synthesizer wherein the feedback path includes a second phase-locked loop that serves as a tracking filter. Modulation is supplied to the main phase-locked loop via a first modulation path that couples the modulating signal to the frequency control terminal of the phase-locked loop voltage-controlled oscillator and via a second modulation path that couples the modulating signal to the phase-locked loop phase detector. To configure the system so that flat modulation is attained, the gain factors of the first and second modulation paths are established in accordance with specific relationships and the second modulation path includes a compensator network having a transfer function that at least aproximates that of the phase-locked loop which is embedded in the system feedback path. Additionally, the modulation signal coupled to both modulation paths is adjusted on the basis of carrier frequency to compensate for frequency-related variation in the transfer characteristics of the main loop VCO. The transfer characteristic of the main loop phase detector is controlled to maintain a constant loop bandwidth.

11 Claims, 3 Drawing Figures

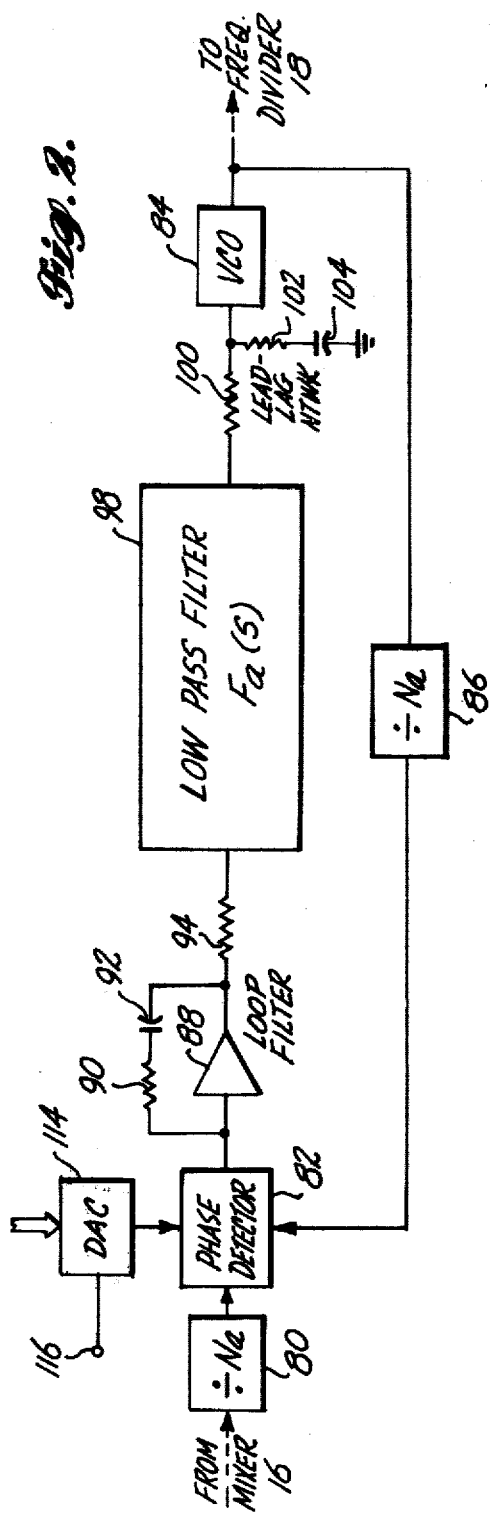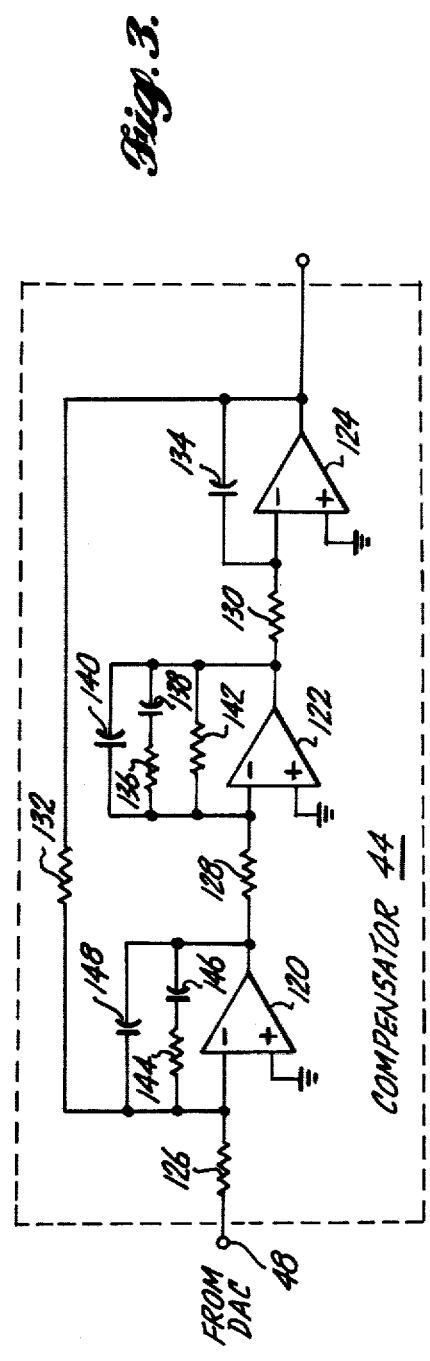

PHASE-LOCKED LOOP FREQUENCY SYNTHESIZER INCLUDING COMPENSATED PHASE AND FREQUENCY MODULATION

BACKGROUND OF THE INVENTION

This invention relates to phase and frequency modulation and more particularly to apparatus and methods for precise phase and frequency modulation of phase-locked loop frequency synthesizers.

It is known in the art that a phase-locked loop circuit can be angle modulated (phase of frequency modulated) over a wide band of frequencies that includes frequencies both greater than and less than the loop bandwidth by injecting modulation components at two separate circuit nodes of the phase-locked loop system. For example, U.S. Pat. No. 4,052,672, issued to Enderby et al. discloses a programmable divide-by-N phase-locked loop system wherein frequency modulation is effected over a relatively wide range of modulation frequencies by phase modulating the system via a first modulation path for all frequencies within the loop bandwidth and by frequency modulating the loop via a second modulation path for all modulating frequencies outside the loop bandwidth. More specifically, in such a prior art arrangement, the first modulation path includes circuitry for integrating the applied modulation signal and for summing the integrated signal with the signal provided by the phase-locked loop phase detector. The second modulation path includes circuitry for summing the applied modulation signal with the frequency control signal (i.e., the loop error signal) that is coupled to the phase-lock loop voltage-controlled oscillator (VCO). Relatively flat modulation characteristics are achieved in such a system by establishing the gain constant (i.e., sensitivity) of the modulation path that includes the integrator circuit substantially equal to the reciprocal of the loop bandwidth.

An alternative prior art arrangement frequency modulates the phase-locked loop reference oscillator, rather than phase-modulating the system phase detector. More specifically, such a prior arrangement differs from the above-described system in that the integrator circuit is omitted and the first modulation path controls the frequency of a reference oscillator (e.g., a voltage-controlled crystal oscillator) that provides the reference signal to the phase-locked loop phase detector. In such a system relatively flat modulation will be attained as long as the gain factor associated with the path including the voltage-controlled crystal oscillator is established so that product of the frequency deviation of the reference oscillator, multiplied by frequency division ratio (N) of the phase-locked loop is equal to the deviation produced by the voltage controlled oscillator that supplies the system output signal.

Although prior art systems of the above-mentioned types may provide satisfactory operation under some conditions, disadvantages and drawbacks are encountered when the phase-lock loop is configured to provide carrier frequencies over an extended frequency range (e.g., an octave or more) and when additional circuitry is included within the phase-lock loop. In particular, the frequency division ratio, N, in such a system is not a constant, but is varied to select the desired carrier frequency. Moreover, the gain factor of the system VCO ($K_v$) is not constant, but exhibits a somewhat unpredictable variation with frequency unless, for example, specialized circuit arrangements such as a YIG-tuned voltage-controlled oscillator are employed. With respect to the inclusion of additional circuitry within the phase-lock loop, such circuitry is often required in order to provide additional features or effect operation beyond the capabilities of a basic phase-lock loop. For example, the copending patent application of Floyd D. Erps, entitled PHASE-LOCK LOOP FREQUENCY SYNTHESIZER, filed of even date with this appliction and assigned to the assignee of this invention discloses a programmable divide-by-N phase-lock loop which provides frequency resolution greatly exceeding that of conventionally-arranged phase-locked loops wherein some embodiments of the disclosed system include a complete phase-locked loop that is embedded in the feedback path of the frequency synthesizer loop. This additional phase-locked loop, in effect, serves as a tracking filter which attenuates spurious signal components produced by a single-sideband mixer circuit.

The high resolution phase-locked loop system disclosed in the above-mentioned patent application of Floyd Erps, and other phase-locked loop arrangements that have additional frequency sensitive networks in the loop feedback path do not exhibit flat modulation characteristics when modulated by the previously-discussed prior art techniques. Further, the variation in the frequency division ratio that is required in order to provide the desired carrier frequencies and frequency-related deviations in the gain factor of the VCO of a phase-locked loop system can easily prevent a system from attaining a desired modulation flatness, including the high resolution phase-locked loop system disclosed in the above-mentioned patent application of Erps.

Accordingly, it is an object of this invention to provide a circuit arrangement for angle modulation of a phase-locked loop system which is augmented with frequency-sensitive components or networks that are embedded in the phase-locked loop feedback path.

It is another object of this invention to provide a signal source that can be selectively phase or frequency modulated wherein the signal source includes compensation for carrier frequency-related variations in the gain factors associated with the loop VCO and compensation for changes in the loop frequency division ratio as well as compensation for variations caused by frequency-sensitive networks that are embedded in the phase-locked loop feedback path.

Still further, it is an object of this invention to provide a modulation compensation network for a high resolution phase-locked loop system of the type disclosed in the above-referenced patent application of Floyd D. Erps.

SUMMARY OF THE INVENTION

In accordance with this invention, a compensator network, installed in the signal path which supplies the modulation signal to the loop phase detector, substantially reduces frequency-related signal variation that is induced by a audio frequency-sensitive network in the loop feedback path and would otherwise preclude use of the previously-mentioned frequency modulation arrangements. For example, in the type of modulated phase-locked loop system disclosed by the previously-referenced patent to Enderby et al., a compensator network configured in accordance with this invention is connected in cascade with the integrator circuit. In the prior art system which employs a frequency-modulated voltage-controlled crystal reference oscillator, the compensator network is connected in cascade with the oscillator frequency control port. In either case, the compensator network is arranged so as to exhibit a transfer function that is equal to, or at least approximates, the transfer function of the frequency-sensitive network within the phase-locked loop feedback path which would otherwise prevent the system from exhibiting a flat modulation characteristic.

To prevent variations in the modulation characteristic caused by changes in the VCO gain factor, the level of the modulation signal that is commonly coupled to both modulation paths is adjusted as a function of carrier frequency (RF frequency) and in inverse proportion to carrier frequency-related changes in VCO gain factor. Similarly, the gain factor of the loop phase detector is controlled as a function of the selected frequency to eliminate changes in loop bandwidth and modulation characteristic that would otherwise occur. In the disclosed embodiments, compensation for changes in VCO gain factor, $K_v$, is effected through the use of a multiplying-type digital-to-analog converter (DAC) unit which, in effect, serves as a variable attenuator that establishes the amplitude of the modulating signal. Compensation for changes in loop bandwidth is effected with a second DAC, which is arranged to control the current supplied to a conventional frequency/phase detector.

In accordance with another aspect of the invention, the disclosed embodiment is arranged to selectively configure the system as a frequency-modulated phase-lock loop or a phase-modulated phase-lock loop. In this regard, the integrator circuit that couples the modulation signal to the system phase detector is configured for operation as an amplifier when a switch that is included in the integrator/amplifier arrangement is activated. In a like manner, an amplifier within the modulation path that supplies a signal to the VCO frequency control terminal is arranged for operation as a differentiator circuit when operation in the phase-modulated mode is initiated. Regardless of whether the system is operated as a phase-modulated or frequency-modulated phase-lock loop, the previously-mentioned compensator unit and compensation for variations in system loop gain and VCO gain factor permit modulation at frequencies both inside and outside the loop bandwidth while providing a relatively constant modulation characteristic over a wide range of carrier frequencies.

The disclosed embodiment is configured to provide substantially flat modulation with a phase-locked loop configured in the manner disclosed in the previously-mentioned patent application of Floyd D. Erps. In this embodiment, the compensator network includes three operational amplifier stages having local feedback networks and overall feedback which establishes a transfer function that approximates that of the complete phase-locked loop network that is embedded in the feedback path of the phase-locked loop which serves as a frequency synthesizer.

BRIEF DESCRIPTION OF THE DRAWINGS

Other objects and advantages of the present invention will be apparent to one of ordinary skill in the art upon consideration of the following description taken together with the accompanying drawing wherein:

FIG. 2 depicts a phase-locked loop which is embedded in the feedback path of the frequency synthesizer of FIG. 1 to serve as a tracking filter; and FIG. 3 illustrates an active circuit arrangement which simulates the transfer function of the phase-locked loop depicted in FIG. 3 and serves as the compensator unit of the arrangement of FIG. 1.

DETAILED DESCRIPTION

Figure 1:
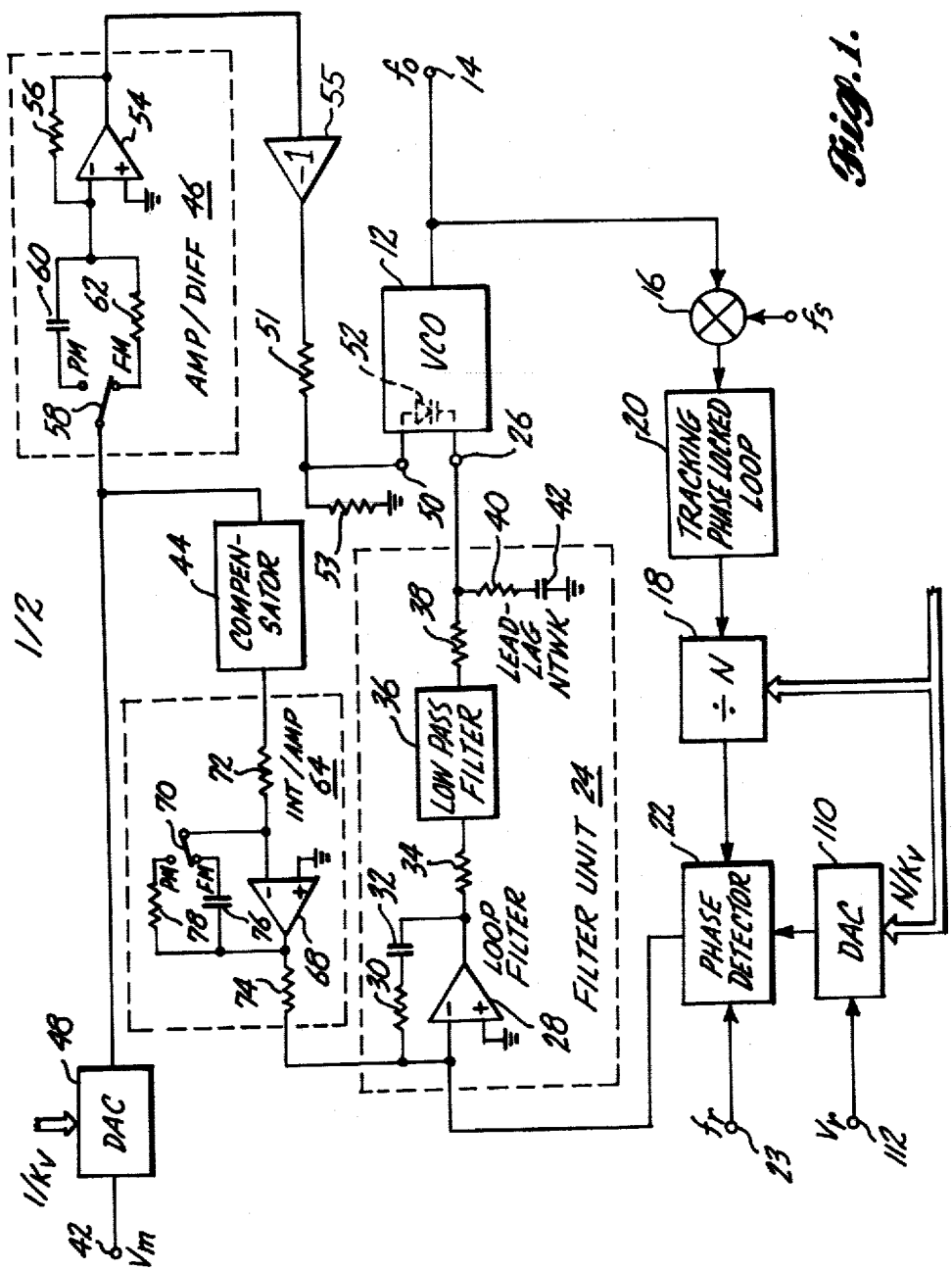
FIG. 1 is a blocked diagram which illustrates the basic arrangement of the invention embodied for use with a phase-locked loop of the type disclosed in the previously-mentioned patent application of Floyd D. Erps.

The invention will now be described relative to an embodiment thereof that is configured for use with an augmented phase-locked loop frequency synthesizer of the type disclosed in the previously-referenced patent application of Floyd D. Erps et al., wherein a second phase-locked loop is embedded in the feedback path of a phase-locked loop frequency synthesizer. In this regard, and with initial reference to FIG. 1, the frequency synthesizer or main loop of the disclosed embodiment includes a voltage-controlled oscillator (VCO) 12 which supplies a signal, at frequency $f_o$, to the system output terminal 14 and to one input port of a mixer circuit 16. As is indicated in FIG. 1, a signal having a frequency $f_s$ is coupled to the second input port of the mixer 16. In the preferred arrangements of the systems disclosed in the patent application of Erps, mixer 16 is a conventional single sideband mixer that is arranged to provide either an upper sideband signal (at a frequency of $f_o+f_s$) or a lower sideband signal (at a frequency $f_o-f_s$) that cause the depicted phase-locked loop to supply an output frequency that differs from that of a conventional programmable divide-by-N phase-locked loop. In particular, when a lower sideband mixer is employed as mixer 16, a signal having a frequency equal to $f_o-f_s$ is coupled to a programmable divider 18, which supplies a signal having an average frequency of $(f_o-f_s)/N$ to one input port of a conventional phase detector circuit 22. As shall be described hereinafter, the depicted circuit stage 20, which couples the signal from mixer 16 to programmable divider 18 is a phase-locked loop arranged to substantially attenuate spurious signals generated within mixer 16.

Regardless of the arrangement of circuit stage 20, phase detector 22 effectively compares the phase of the signal supplied by the programmable divider 18 with the phase of a reference signal $f_r$ (applied to the second input terminal of the phase detector 22), and supplies an error signal having a magnitude proportional to the phase difference between the reference signal and the signal supplied by programmable divider 18.

The error signal supplied by phase detector 22 is coupled to a frequency control terminal 26 of VCO 12 by a filter unit 24. As is indicated in FIG. 1, filter unit 24 is of the type conventionally employed in phase-locked loop systems. In this regard, the first circuit stage of filter unit 24 is commonly identified as the loop filter and includes an operational amplifier 28 having its inverting input terminal connected for receiving the signal supplied by phase detector 22 and for receiving modulation component that is supplied via a first modulation path that is described hereinafter. A resistor 30 and a cpacitor 32 are serially connected between the inverting input and output terminals of operational amplifier 28 to form a feedback path and a resistor 34 couples the signal supplied by the depicted loop filter to a low-pass filter stage 36. Low-pass filter stage is a conventionally-arranged passive or active network which is generally configured to eliminate signal components at the reference frequency $f_r$ and supplies the system error signal to frequency control terminal 26 of VCO 12 via a resistor 38. As is shown in FIG. 1, resistor 38 is one element of a conventional lead-lag network that also includes resistor 40 and capacitor 42, which are connected in series between circuit common potential and the electrode of resistor 38 that is connected to VCO 12.

In view of the above-discussed arrangement it can be recognized that, in the absence of the hereinafter-discussed modulation signal, VCO 12 will be locked to a frequency $f_o = Nf_r + f_s$, which exhibits improved resolution over a conventional programmable divide-by-N phase-locked loop system that supplies an output signal at a frequency $Nf_r$. In this regard, the phase-locked loop systems disclosed in the previously-mentioned patent application of Floyd D. Erps are augmented with additional circuit arrangements which cause the system VCO to lock at a frequency equal to $Nf_r \pm f_s \pm f_d$, where $f_d$ is the frequency of a control signal that is applied to an additional circuit stage that interconnects the single-sideband mixer 16 and the programmable frequency divider 18. Since, the structure of such pulse incrementor circuits and the associated operational aspects of the overall arrangement disclosed in the Erps patent application are not essential to the operation of this invention, a more detailed discussion of such a system is not presented herein, but is incorporated by reference.

Turning now to modulation of the above-discussed phase-locked loop, the embodiment of FIG. 1 includes two modulation paths so as to permit modulation at rates both inside and outside the bandwidth of the phase-locked loop and is arranged for either frequency or phase modulation. In the arrangement of FIG. 1, the modulation signal $V_m$ is applied to a terminal 42 and commonly coupled to the input ports of a compensator unit 44 and an amplifier/differentiator unit 46 via a multiplying-type digital-to-analog converter (DAC) 48. As shall be recognized upon fully understanding the manner in which the invention operates to provide precise frequency compensation, DAC 48 is effectively a variable attenuator that is controlled by a parallel format digitally-encoded signal (denoted by the double arrow in FIG. 1) so as to equalize the system for frequency-related variations in the gain factor, $K_v$, of VCO 12.

To form one of the modulation paths, an amplifier/differentiator 46 couples the signal supplied by DAC 48 to a second frequency control terminal 50 of VCO 12. In this regard, those skilled in the art will recognize that various conventional VCO's are available which, in effect, include circuitry for summing two frequency control signals. For example, various VCO's of the type indicated in FIG. 1 are available wherein individual frequency control signals can be coupled to the two electrodes of a varactor diode 52 which controls the VCO output frequency. Moreover, it can be recognized that equivalent operation can be attained by utilizing a conventional signal summing unit in conjunction with a VCO having a single frequency control terminal. Regardless of the type of VCO employed, amplifier/differentiator 46 is selectively operable for either amplifying or differentiating the modulation signal supplied to VCO 12 when the system is being utilized for frequency modulation (FM) or phase modulation (PM), respectively. In particular, amplifier/differentiator 46 includes an operational amplifier 54 having its output terminal coupled to terminal 50 of VCO 12 via a signal inverter 55 and a voltage divider formed by resistors 51 and 53. A feedback resistor 56 is connected between the output terminal and the inverting input terminal of operational amplifier 54. The input terminal of amplifier 54 is coupled to a first contact of a switch 58 via a capacitor 60 and is coupled to a second contact of the switch 58 via a resistor 62. Switch 58, which is symbolized in FIG. 1 as a single-pole double-throw switch having the wiper contact thereof connected for receiving the signal supplied by DAC 48, is generally realized by one or more semiconductor circuits, such as those utilizing field-effect transistors. Regardless of the structure utilized, when switch 58 is in the depicted FM position, amplifier/differentiator 56 forms a conventional inverting operational amplifier configuration having a gain equal to $-R_{56}/R_{62}$. On the other hand, when switch 58 is activated to the PM state, amplifier/differentiator 46 forms an operational amplifier differentiator circuit, which effects phase modulation of VCO 12 for modulation rates exceeding the phase-locked loop bandwidth.

To form the second modulation path, an integrator/amplifier 64 couples the signal supplied by compensator 44 to the inverting input terminal of operational amplifier 28, which forms the loop filter of filter unit 24. As shall be described hereinafter, compensator unit 44 includes a network that counteracts the audio frequency-related variations in modulation that would otherwise be induced by network 20 which is located in the phase-lock loop feedback path. Integrator/amplifier 64 includes an operational amplifier 68 having its inverting input terminal connected to the wiper contact of a switch 70 and connected for receiving the signal supplied by compensator 64 via an input resistor 72. The output terminal of operational amplifier 68 is coupled to the inverting input terminal of operational amplifier 28 via a resistor 74 and is connected to the FM and PM contacts of switch 70 via a capacitor 76 and a resistor 78, respectively.

Those skilled in the art will recognize that integrator/amplifier 64 forms a conventional operational amplifier integrator circuit when switch 70 is activated to the FM state. On the other hand, when switch 70 is activated to the PM state, integrator/amplifier 64 functions as a conventional inverting operational amplifier stage having a gain substantially equal to $-R_{78}/R_{72}$.

With regard to the use of inverting and noninverting circuit stages in the first and second modulation paths it should be noted that both paths should exhibit the same input signal to output signal phase relationship. That is, if one modulation path is arranged so that an audio modulation signal applied to terminal 42 causes a decrease (increase) in signal phase or frequency, the other modulation path must be arranged to exhibit a like-type of change in signal phase or frequency.

Reference will now be made to FIG. 2, which depicts a phase-locked loop of the type embedded in the feedback path of the phase-locked loop frequency synthesizer disclosed in the previously-mentioned patent application of Floyd D. Erps and hence corresponds to network 20 of the embodiment of the invention depicted in FIG. 1. In this arrangement, a frequency divider 80 receives the signal supplied by single sideband mixer 16 (FIG. 1) at the frequency $f_o - f_s$, where, as mixer 16 (FIG. 1) at the frequency $f_o - f_s$, where, as previously described, $f_o$ is the frequency of the VCO 12 and $f_s$ is the frequency of the signal supplied to the second input port of the single sideband mixer 16. The signal supplied by frequency divider 80 is coupled to the first input port of a conventional phase detector 82 having the second input port thereof connected for receiving the signal supplied by a VCO 84 via a frequency divider 86. As is the case with the main loop of the frequency synthesizer arrangement, the signal supplied by the phase detector 82 is coupled to the frequency control terminal of the VCO 84 via a cascaded loop filter, low-pass filter, and lead-lag network. In this regard, the loop filter includes an operational amplifier 88 having a resistor 90 and capacitor 92 serially connected to form a feedback path with a resistor 94 being connected to couple the signal supplied by operational amplifier 88 to the input of the low-pass filter stage 98. Like the low-pass filter 36 utilized in the main phase-locked loop, low-pass filter 98 is a conventional active or passive filter network. Similarly, the lead-lag network employed in the phase-lock loop of FIG. 2 is structurally equivalent to that of the main loop, being formed by two resistors 100 and 102 and a capacitor 104 that are connected as a voltage divides between the output terminal of the low-pass filter and circuit common with the junction between the resistors being connected to the frequency control terminal of VCO 84.

As previously mentioned, the phase-locked loop arrangement of FIG. 2 is embedded in the feedback path of the frequency synthesizer loop (FIG. 1) and serves as a tracking filter that substantially reduces spurious signal components introduced by nonlinear operation of mixer 16. In this arrangement, the frequency divider 80 is utilized to prescale the frequency $f_o - f_s$ of the signal supplied by the single sideband mixer 16 of FIG. 1 and thereby supply a reference frequency $(f_o - f_s)/N_a$ to the phase detector 82, where $N_a$ is the frequency division ratio of frequency divider 80. Such prescaling is advantageous in that it reduces the frequency of operation of phase detector 82 and improves circuit operation when a modulating signal is applied. Since the frequency divider 86 also exhibits a division ratio of $N_a$, the signal supplied by VCO 84 exhibits the original frequency, $f_o - f_s$.

The manner in which the invention compensates for frequency-related variations in the feedback signal of the main phase-lock loop that are induced by the additional phase-lock loop of FIG. 2 (or by other structure) and further compensates for other frequency-related variations that affect modulation flatness can best be described in terms of the modulation transfer function of the arrangement depicted in FIG. 1. In this regard it can be shown that the modulation characteristic when the system is being frequency modulated is:

$$\frac{\Delta f}{V_m'} = K_v \frac{A_3(K_i/s)F(s)L(s) + A_1A_2}{K_vK_pF(s)C(s)(NS) + 1} \quad (1)$$

where, $\Delta f$ is the frequency deviation resulting from a signal $V_m'$ that is supplied at the output terminal of DAC 48; $K_v$ denotes the gain factor of VCO 12; $K_p$ indicates the gain factor of phase detector 22; $K_i = -1/(R_{72}C_{76})$ denotes the gain factor of integrator/amplifier 64, during operation in the integration mode; S denotes the Laplacian operator; F(s) denotes the transfer function of the entire filter unit 24; L(s) denotes the transfer function of compensator 44; C(s) denotes the transfer function of the network 20 that is embedded in the feedback path of the main phase-lock loop, i.e., the additional phase-lock loop of FIG. 2; $A_1 = R_{56}/R_{62}$ is the gain of amplifier/differentiator 46, when operating in the amplifier mode; $A_2 = R_{53}/(R_{51} + R_{53})$ is the voltage transfer ratio of the attenuator (voltage divider) defined by resistors 51 and 53; $A_3 = -R_{30}/R_{74}$ represents the gain of the loop filter (operational amplifier 28) at frequencies at which the impedance of capacitor 32 is substantially less than the resistance value of $R_{30}$; and N indicates the division ratio of frequency divider 18.

From Equation 1 it can be shown that the system of FIG. 1 will exhibit a constant modulation transfer function:

$$\Delta f/V_m' = A_1A_2A_3K_v$$

if:

(a) $K_iA_3/A_1A_2 = K_vK_p/N$; and
(b) $L(s) = C(s)$

When switches 58 and 70 are activated to place the arrangement of FIG. 1 in the PM mode, it can be shown that the phase modulation transfer characteristic is:

$$\frac{\Delta\phi}{V_m'} = K_v \frac{(A_3A_4F(s)L(s))/s + K_dA_2}{K_vK_pF(s)C(s)/(NS) + 1} \quad (2)$$

where $K_d = R_{56}C_{60}$, the gain factor of amplifier/differentiator 46 when operating in the PM mode and $A_4 = R_{78}/R_{72}$ is the gain of integrator/amplifier 64 in the PM mode.

Thus, the system will exhibit a constant (flat) phase modulation transfer function:

$$\Delta\phi/V_m' = K_dA_2K_v$$

if:

(a) $A_3A_4/A_2K_d = K_vK_p/N$; and
(b) $L(s) = C(s)$

Accordingly, to provide flat modulation characteristics in both the frequency modulation (FM) and phase modulation (PM) modes, the embodiment of FIG. 1 is configured so that the transfer function of the compensator 44 (L(s)) is identically equal to, or at least approximates, the transfer function of the frequency-sensitive network embedded in the feedback path of the main loop (C(s)) (i.e., tracking phase-locked loop 20 of FIGS. 1 and 2) over the entire range of carrier frequencies. In addition, from the above set forth equations, it can be seen that the system should be arranged with:

$$\frac{K_iA_3}{A_1A_2} = \frac{K_vK_p}{N} = \frac{A_3A_4}{A_2K_d} \quad (3)$$

which requires that $K_iK_d = A_1A_4$.

The above set forth relationships between the various circuit parameters do not impose strict design constraints, but, in fact, are rather easily satisfied. In this regard, operation of the system of FIG. 1 is determined by a greater number of circuit parameters than is the operation of prior art arrangements such as that disclosed in the previously-mentioned patent to Enderby et al. This permits greater design freedom and provides a greater opportunity to optimize system performance.

To compensate for the changes in VCO gain factor ($K_v$) that occur with respect to a relatively wide range of carrier frequencies, the embodiment of FIG. 1 includes DAC 48, which adjusts the level of the applied modulation signal ($V_m'$) by an amount necessary to offset a change in $K_v$. In particular, the digitally-encoded signal supplied to DAC 48 is selected so as to multiply the modulation signal applied to terminal 42 by a factor that is proportional to $1/K_v$. For example, in one embodiment of the invention, the frequency range of the main loop is subdivided into a plurality of contiguous subbands, each spanning an equal frequency interval. In this arrangement, the subband associated with each particular system frequency can be identified by the integer portion of the ratio $B=(f_x-f_a)/\Delta f$, where B denotes the subband number, $f_x$ denotes the frequency of interest, $f_a$ indicates the lowest system frequency and $\Delta f$ indicates the frequency interval defined by each subband. Using this method of identification, digitally-encoded signals that provide the proper compensation for each subband are stored in a programmable read-only memory (PROM) of the embodiment being discussed. As each particular frequency is selected, a microprocessor unit determines the associated subband through use of the above-mentioned relationship; accesses the appropriate stored value and supplies the digitally-encoded signal to DAC 48.

The embodiment of FIG. 1 also includes an additional digital-to-analog converter (DAC) 110 which controls the gain factor $K_p$ of phase detector 22 so as to maintain a constant loop bandwidth at all selected frequencies, i.e., vary $K_p$ in proportion to N/Kv for all possible carrier frequencies ($Nf_r-f_s$, for the embodiment of FIG. 1). Various methods can be employed for supplying the necessary digitally-encoded signal to DAC 110 and for suitably adjusting the gain factor of phase detector 22. For example, in the above-mentioned embodiment of the invention which utilizes a microprocessor and a programmable read-only memory, digitally-encoded values appropriate to each of the above-mentioned subbands can be stored in the PROM and supplied to DAC 110 as each frequency is selected. Regardless of the technique employed, phase detector 22 can be, for example, a conventionally-arranged frequency/phase detector wherein a current supplied to the phase detector establishes the value of the gain coefficient $K_p$.

Turning now to describing suitable structure of a compensator 44 for use with the embodiment of FIG. 1, it can be shown that the ratio of output phase to input phase, $\phi_{oc}/\phi_{ic}$, for the tracking phase-lock loop that is embedded in the feedback path of the main loop and depicted in FIG. 2 is:

$$C(s) = \frac{\phi_{oc}}{\phi_{ic}} = \frac{\frac{\omega_a(s + z_1)(s + z_2)F_a(s)}{s^2(s + p_1)}}{1 + \frac{\omega_a(s + z_1)(s + z_2)F_a(s)}{s(s + p_1)}} \quad (4)$$

where:

$\omega_a$ is the bandwidth of the phase-lock depicted in FIG. 2, i.e., $\omega_a = K_{pa}K_{va}A_a/N_a$;
$z_1 = 1/(R_{90}C_{92})$;
$z_2 = 1/(R_{102}C_{104})$;
$p_1 = 1/(R_{94}+R_{100}+R_{102})C_{104}$;
$A_a = R_{102}/(R_{94}+R_{100}+R_{102})$; and
$N_a$, $K_{va}$ and $K_{pa}$ respectively indicate the frequency division ratio of frequency divider 86, and the gain factors of VCO 84 and phase detector 82 and $F_a(s)$ is the transfer characteristic of low-pass filter 98.

As is indicated in FIG. 3, if desired or necessary, a multiplying-type digital-to-analog converter (DAC) 114 can be included in an embodiment of the invention to maintain the bandwidth of the phase-locked loop depicted in FIG. 2 substantially constant. In this regard, in the arrangement of FIG. 2, an analog signal (DC signal) is applied to the analog input of DAC 114 via a terminal 116. Digitally-encoded information which will maintain the loop bandwidth substantially constant is applied to DAC 114, for example, by utilizing the above-mentioned arrangement of a microprocessor which accesses data stored in a PROM on the basis of the selected system frequency.

Regardless of whether or not DAC 114 is employed, the above-stated transfer function of the tracking phase-locked loop of FIG. 2 (Equation 4) can be satisfactorily simulated by the active network depicted in FIG. 3 so that the system frequency and phase modulation characteristic can be made independent of modulating frequency by arranging the embodiment of FIG. 1 in accordance with the constraints set forth in Equation 3. Referring to FIG. 3, the depicted active network includes three operational amplifiers 120, 122 and 124 wherein the inverting input terminal of operational amplifier 120 is connected for receiving the modulation signal supplied by DAC 48 via a resistor 126. The inverting input terminals of operational amplifiers 122 and 124 are respectively connected to the output terminals of operational amplifiers 120 and 122 via resistors 128 and 130 and a resistor 132 supplies multistage feedback from the output terminal of operational amplifier 124 to the inverting input terminal of operational amplifier 120. In addition, each operational amplifier includes a local feedback network such as the capacitor 134 that is connected between the output terminal and inverting input terminal of operational amplifier 124. With respect to operational amplifier 122, the local feedback network consists of a resistor 136 and capacitor 138 that are connected in series with one another and in parallel with both a capacitor 140 and resistor 142. As is further illustrated in FIG. 3, the local feedback network for operational amplifier 120 includes a serially-connected resistor 144 and capacitor 146 that are connected in parallel with a capacitor 148.

Basically, the portion of the circuit of FIG. 3 that includes operational amplifier 120, resistor 126 and the feedback network consisting of resistor 144 and capacitor 146 simulates phase detector 82 and loop filter 92 of the phase-lock loop depicted in FIG. 2 whereas all circuit components associated with operational amplifier 122, except feedback capacitor 140, simulate the lead-lag network of FIG. 2 (resistors 94, 100, 102 and capacitor 104) and the circuit stage including operational amplifier 124 simulates the VCO 84 of FIG. 2. In the arrangement of FIG. 3, the low-pass filter of FIG. 2 is simulated by two-real circuit poles introduced by the feedback capacitors 140 and 148. More specifically, it can be shown that the transfer function of the active network depicted in FIG. 3 is:

$$L(s) = \frac{\frac{\omega_c}{s^2} \frac{R_{132}P_3P_4}{R_{126}} \frac{(s+Z_1)(s+Z_2)}{(s+P_2)(s+P_3)(s+P_4)}}{1 + \frac{\omega_c}{s^2} \frac{P_3P_4}{R_{132}} \frac{(s+Z_1)(s+Z_2)}{(s+P_2)(s+P_3)(s+P_4)}} \quad (5)$$

where:
$\omega_c = R_{144}R_{136}/(R_{132}R_{128}R_{130}C_{134})$;
$Z_1 = 1/(R_{144}C_{146})$;
$Z_2 = 1/(R_{136}C_{138})$;
$P_2 = 1/(R_{142}C_{138})$;
$P_3 = 1/(R_{136}C_{140})$;
$P_4 = 1/(R_{144}C_{148})$.

If all resistors except $R_{142}$ exhibit a common value, R, Equation 3 can be expressed as:

$$L(s) = \frac{\frac{\omega_c P_3 P_4}{s^2} \frac{(s+Z_1)(s+Z_2)}{(s+P_2)(s+P_3)(s+P_4)}}{1 + \frac{\omega_c P_3 P_4}{s^2} \frac{(s+Z_1)(s+Z_4)}{(s+P_2)(s+P_3)(s+P_4)}} \quad (6)$$

with $\omega_c = 1/(RC_{134})$

Comparing the transfer function for the compensator 44 depicted in FIG. 3 (Equation 6) with the transfer function, which is set forth in Equation 4, for the tracking phase-locked loop of FIG. 2 that is used to augment the main phase-locked loop of FIG. 1, it can be seen that the transfer functions would be of identical form if $F_a(s) = P_3P_4/[(s+P_3)(s+P_4)]$. In this regard, and as previously mentioned, it has been determined that the circuit poles $P_3$ and $P_4$ that are established in the transfer characteristic of the active network of FIG. 3 by capacitors 140 and 148, respectively, provide a satisfactory simulation of the low-pass filter utilized in the phase-locked loop of FIG. 2. More specifically, although a filter arrangement identical to that utilized as the low-pass filter in the arrangement of FIG. 2 could be connected in cascade with the amplifier stages of the simulated network that is depicted in FIG. 4 to provide a more accurate simulation of the phase-locked loop of FIG. 2, the improved accuracy attained does not justify the additional circuit complexity and cost. If necessary or desired, computer-aided design techniques can be employed to optimize the location of circuit poles $P_3$ and $P_4$, i.e., determine optimum values of capacitors 140 and 148.

With continued reference to the transfer function for the phase-locked loop of FIG. 2 (Equation 4) and the simulated representation of the phase-locked loop that is illustrated in FIG. 3 (Equation 5), it can be seen that establishing the respective circuit zeroes equal to one another requires that $R_{90}C_{92} = R_{144}C_{146}$ and that $R_{102}C_{104} = R_{136}C_{138}$. Further, it can be seen that setting the pole at $P_1$ of Equation 4 equal to the pole at $P_2$ in Equation 6 requires that $(R_{94}+R_{100}+R_{102})C_{102} = R_{142}C_{138}$. As previously stated, it is also necessary to set the bandwidth of the compensator network 40 substantially equal to the bandwidth of the phase-locked loop depicted in FIG. 2. The bandwidth $\omega_c$ of the compensation network is equal to $(R_{144}R_{136})/(R_{132}R_{128}R_{130}C_{134})$, which reduces to $1/(RC_{134})$ under the assumption that all resistors in the arrangement of FIG. 3 (except resistor 142) exhibits a resistance value of R. Thus, establishing the bandwidth of the two networks equal to one another requires that $1/(RC_{134}) = K_{pa}K_{va}K_a/N_a$, where the parameters are identical to those previously defined for FIG. 2.

It should be recognized that embodiments of the invention will often utilize conventional integrator and differentiator arrangements that are more complex than those disclosed herein. In such embodiments of the invention or under other circumstances in which the transfer characteristic of one of the modulation paths is changed or altered, compensatory alterations should be included in the other modulation path. Thus, for example, when a differentiator utilizing a resistor in series with capacitor 60 is utilized the circuit pole introduced in the transfer function of the differentiator should be offset by introducing a corresponding pole into the transfer function of the amplifier network utilized in integrator/amplifier 64. For example, a small capacitor may be connected in parallel with resistor 78.

Those skilled in the art will also recognize that the embodiment of the invention disclosed herein is exemplary in nature and that many variations and modifications can be made without exceeding the scope and the spirit of the invention. For example, although the invention is disclosed in terms of a high resolution phase-lock loop of the type described in the previously-mentioned patent application of Floyd D. Erps, the mathematical relationships set forth herein demonstrate that the invention can be practiced in any situation wherein frequency-sensitive networks or components are embedded in any presently-known type of phase-lock loop. For example, the invention has been satisfactorily embodied with a low noise phase-lock loop arrangement of the type disclosed in the copending patent applications of Donald L. Meyer and Kingsley W. Craft, respectively entitled "Controlled Frequency Signal Source Apparatus Including A Feedback Path For The Reduction Of Phase Noise" and "Frequency Modulated Phase-Locked Signal Source", each of which patent applications is filed of even date with this application and is assigned to the assignee of this invention. Further, the invention can be practiced in the previously mentioned type of prior art phase-locked loop system wherein the modulation signal that is coupled to the phase detector modulates a reference oscillator which supplies the reference signals to the phase detector input port. In such a system, a compensator that is configured in the manner described herein is installed in the signal path that couples the modulating signal to the frequency control port of the reference oscillator.

The embodiments of the invention in which an exclusive property or privilege is claimed are defined as follows:

1. An improved modulated phase-locked loop system of the type including phase detector means having first and second input ports and an output port and controlled oscillator means for supplying an output signal at a frequency determined by a frequency control signal applied to a control terminal of said controlled oscillator means, said controlled oscillator output signal, coupling means responsive to a signal at a reference signal to provide said frequency control signal coupled to said first and second input ports of said phase detector means and said output port of said phase detector means being coupled to said controlled oscillator control terminal, said modulated phase-locked loop including first and second modulation paths with said first modulation path supplying a modulation signal to said controlled oscillator control terminal and said second modulation path supplying said modulation signal to an input port of said coupling means; wherein the signal path coupling said output signal of said controlled oscillator means to said first input port of said phase detector includes circuit means having a transfer characteristic that varies as a function of the frequency of the output signal produced by said controlled oscillator means; and wherein said improvement comprises compensator means connected in said second modulation path for substantially eliminating differences in system modulation characteristic caused by said circuit means as a function of the carrier frequency of said modulated phase-locked loop system, said compensator means being configured and arranged to exhibit a transfer characteristic that substantially equals said transfer characteristic of said circuit means in said signal path coupling said output signal of said controlled oscillator means to said first input port of said phase detector means.

2. The modulated phase-locked loop system of claim 1 further including signal integration means connected in said second modulation path for receiving said modulation signal, said signal integration means having an output port coupled to said input port of said coupling means.

3. The modulated phase-locked loop system of claim 2 further including frequency divider means having an input terminal, an output terminal and at least one control terminal for application of a frequency programming signal, said input terminal of said frequency divider means being connected for receiving said signal supplied by said controlled oscillator means, said output terminal of said frequency divider means being connected for coupling said controlled oscillator output signal to said first input port of said phase detector means, said frequency divider means for dividing the signal coupled thereto by a factor N that is determined by said programming signal applied to said frequency divider control terminal.

4. The modulated phase-locked loop system of claim 3 wherein said signal integration means is configured and arranged to exhibit a transfer characteristic having a gain factor of $K_i$, said first modulation path includes gain means and said first and second modulation paths are further configured and arranged to comply with the constraint $K_i A_1/A_2 = K_v K_p/N$, where $A_1$ represents the signal gain of all components other than said compensating means and said signal integrating means that is included in said second modulation path, $A_2$ represents the signal gain within said first signal path, $K_v$ represents the gain factor of said controlled oscillator means and $K_p$ represents the gain factor of said phase detector means.

5. The modulated phase-locked loop system of claim 1 further including signal differentiation means connected in said first modulation path for coupling said modulating signal to said frequency control terminal of said controlled oscillator means, said signal differentiation means exhibiting a transfer function having a gain constant of $K_d$.

6. The modulated phase-locked loop system of claim 5 further including frequency divider means, having an input terminal, an output terminal and at least one control terminal for application of a programming signal, said output signal supplied by said controlled oscillator means being coupled to said input terminal of said frequency divider means, said output terminal of said frequency divider means being coupled to said first input port of said phase detector means, said frequency divider means including means for dividing the frequency of an applied signal by a factor of N, where N is determined by said programming signal; and wherein said first and second modulation paths are further configured and arranged to substantially satisfy the constraint $A_3/(K_d A_4) = K_v K_p/N$, where $A_3$ represents the total signal gain of said second modulation path excluding said compensating means and $A_4$ represents the signal gain of another portion of said first modulation path that excludes said signal differentiation means.

7. The modulated phase-locked loop system of claim 1 wherein said second modulation path includes second circuit means selectively operable for signal integration and signal amplification and wherein said first modulation path includes circuit means selectively operable for signal amplification and signal differentiation; said modulated phase-locked loop system further comprising switch means for selectively activating said signal integration means of said first circuit means in conjunction with said amplification means of said first circuit means to frequency modulate said phase-locked system, said switching means further including means for selectively activating said signal amplification means of said second circuit means in conjunction with said signal differentiation means of said second circuit means to phase modulate said phase-locked loop system.

8. The improved modulated phase-locked loop system of claims 1, 2, 3, 4, 5, 6 or 7 further comprising means for controlling the level of the signal coupled to both said first and second modulation paths as an inverse function of said gain factor of said phase-locked loop controlled oscillator means, $K_v$.

9. The improved phase-locked loop system of claim 3, 4, or 6 further comprising circuit means for controlling the value of said gain factor of said phase detector means in direct proportion to N and in inverse proportion to $K_v$.

10. The improved phase-locked loop system of claim 9 wherein said circuit means having a transfer characteristic that varies as a function of the frequency of the controlled oscillator means output signal comprises a second phase-locked loop system and said compensator means is an active network for simulating said second phase-locked loop system.

11. Signal generating apparatus for selectively supplying a frequency-modulated or phase-modulated signal to a system output terminal, said signal generating apparatus comprising:
 a voltage-controlled oscillator responsive to an applied control signal for supplying a signal at a frequency determined by said applied control signal, said voltage-controlled oscillator having an output terminal connected to said system output terminal;
 signal mixing means having first and second input ports and an output port, said first input port of said signal mixing means being connected for receiving said signal supplied by said voltage-controlled oscillator, said second input port of said signal mixing means being connected for receiving an applied periodic signal;
 tracking phase-locked loop means having a predetermined signal transfer characteristic and having an input port and an output port, said input port of said tracking phase-locked loop means being connected to said output port of said signal mixing means;
 programmable frequency divider means responsive to an applied frequency programming signal, said programmable frequency divider means having an input terminal and an output terminal with said input terminal being connected to said output terminal of said tracking phase-locked loop;
 phase detector means having first and second input ports and an output port, said first input port of said phase detector means being connected to said output terminal of said programmable frequency divider means, said second input port of said phase detector means being connected for receiving a reference signal at a predetermined frequency;
 filter means having an input terminal and an output terminal, said input terminal of said filter means being connected to said output port of said phase detector means, said output terminal of said filter means being connected for supplying a portion of said control signal to said voltage-controlled oscillator means;

modulation compensation means having an input terminal and an output terminal, said input terminal of said modulation compensation means being connected for receiving a modulation signal, said modulation compensation means including circuit means having a signal transfer characteristic that is substantially equal to the signal transfer characteristic of said tracking phase-locked loop;

integrator/amplifier means having an input terminal and an output terminal, said input terminal of said integrator/amplifier means being connected to said output terminal of said modulation compensation means, said output terminal of said integrator/amplifier means being connected to said input terminal of said filter means, said integrator/amplifier means including circuit means for selectively amplifying a signal supplied to said input terminal of said integrator/amplifier means or selectively integrating a signal applied to said input terminal of said integrator/amplifier means, said integrator/amplifier means further including switch means for selectively operating said circuit means for integrating or amplifying; and amplifier/differentiator means having an input terminal and an output terminal, said output terminal of said amplifier/differentiator means being connected to supply a second portion of said control signal of said voltage-controlled oscillator means, said input terminal of said amplifier/differentiator means being connected for receiving said modulation signal, said amplifier/differentiator means including circuit means for selectively amplifying a signal applied to said input terminal of said amplifier/differentiator means or differentiating a signal applied to said input terminal of said amplifier/differentiating means, said amplifier/differentiator means further including switch means for selectively operating said circuit means for amplifying or differentiating.

* * * * *